United States Patent [19]
Wilkerson

[11] 4,074,194
[45] Feb. 14, 1978

[54] WATT METER PROVIDING ELECTRICAL SIGNAL PROPORTIONAL TO POWER

[76] Inventor: Alan W. Wilkerson, 410 Madero, Thiensville, Wis. 53092

[21] Appl. No.: 773,070

[22] Filed: Feb. 28, 1977

[51] Int. Cl.² .............................................. G01R 7/00
[52] U.S. Cl. .................................. 324/142; 364/483; 364/841; 328/160
[58] Field of Search ................... 324/142; 235/151.31, 235/151.3, 194; 328/160

[56] References Cited
U.S. PATENT DOCUMENTS

| Re. 29,079 | 12/1976 | Gilbert | 324/142 X |
|---|---|---|---|
| 3,470,471 | 9/1969 | Moore | 324/142 |
| 3,588,713 | 6/1971 | Yareck | 328/160 |
| 3,942,110 | 3/1976 | Milkovic | 324/142 |

Primary Examiner—Stanley T. Krawczewicz
Attorney, Agent, or Firm—Andrus, Sceales, Starke & Sawall

[57] ABSTRACT

A watt meter circuit capable of providing an electrical signal indicative of power includes a signal forming means for providing a pair of signals proportional to current. The signals are equal to each other in magnitude but opposite in polarity and are provided in parallel through a switch to filter which provides the electrical power signal. The switch is operated by a signal generating means which generates a triangular wave form. The voltage to the watt meter is compared with the triangular wave form to vary the duty cycle of the switch and the magnitude and polarity of the output signal in accordance with the algebraic product of voltage and current.

10 Claims, 13 Drawing Figures

Power Consumption
Power Generation

Power Consumption
Power Generation

Power Consumption
Power Generation

Power Consumption
Power Generation

WATT METER PROVIDING ELECTRICAL SIGNAL PROPORTIONAL TO POWER

BACKGROUND OF THE INVENTION — FIELD OF THE INVENTION

The present invention relates to a watt meter capable of providing an electrical signal proportional to power.

BACKGROUND OF THE INVENTION — DESCRIPTION OF THE PRIOR ART

Watt meters are employed to measure power — the algebraic product of the voltage across an electrical element and the current through the element. A conventional watt meter typically employs a dynamometer type movement having a fixed field coil and a moving coil connected to a pointer. The field coil may be energized in accordance with the current while the moving coil is energized in accordance with the voltage. The electromagnetic interaction of the field and moving coils deflects the pointer in accordance with the algebraic product of current and voltage so that power consumption or generation is indicated on a scale.

In many instances it is desired to obtain an electrical signal proportional to power rather than a visual indication. Such a signal may be used for power control purposes or may be digitized to provide a digital read-out. As a result watt meters have been developed which provide an electrical signal. One such watt meter employs a Hall-effect multiplier. However, such a multiplier requires a magnetic field, leading to problems with residual magnetism, linearity, and band width which result in reduced accuracy. Another such watt meter employs a transconductance multiplier utilizing the logarithmic nature of semi-conductor junctions. However, the operation of such circuitry is greatly affected by temperature variations and even with temperature compensation desired accuracies are not always obtained.

SUMMARY OF THE PRESENT INVENTION

It is, therefore, the object of the present invention to provide an improved watt meter capable of providing an electrical signal proportional to power. More specifically, it is the object of the present invention to provide such a watt meter which is highly accurate over a wide range of operating conditions and frequencies, which is simple in construction and operation, and which is low in cost.

The watt meter of the present invention includes a signal forming means coupled to a first input terminal receiving, for example, the current signal. The signal forming means, formed of a pair of series connected inverting amplifiers, provides a pair of signals corresponding to the current signal. The pair of signals are equal to each other in magnitude but opposite in polarity. The signals are provided in parallel through the switching contacts of a switch means to a signal terminal. A filter means connected to the switch means provides the electrical signal output of the watt meter.

The switch means is operated by a comparator. One input to the comparator is the other input to the watt meter, for example, the voltage signal. The second input to the comparator is a precisely generated bipolarity cyclical wave form, typically a triangular wave form in which the wave portions are linear and the positive and negative peak magnitudes are equal. The comparator operates the switch means in accordance with the comparison of the input voltage and the cyclical wave form to vary the duty cycle of the switch and the magnitude and polarity of the output signal of the watt meter in accordance with the algebraic product of the voltage and current, thereby to provide an electrical indication of the power consumed or generated.

Means such, as an integrator responsive to the positive and negative half cycles of the cyclical wave, insures that the peak magnitudes are maintained equal.

DETAILED DESCRIPTION OF THE PREFERRED EMBODIMENT

Figure 1:
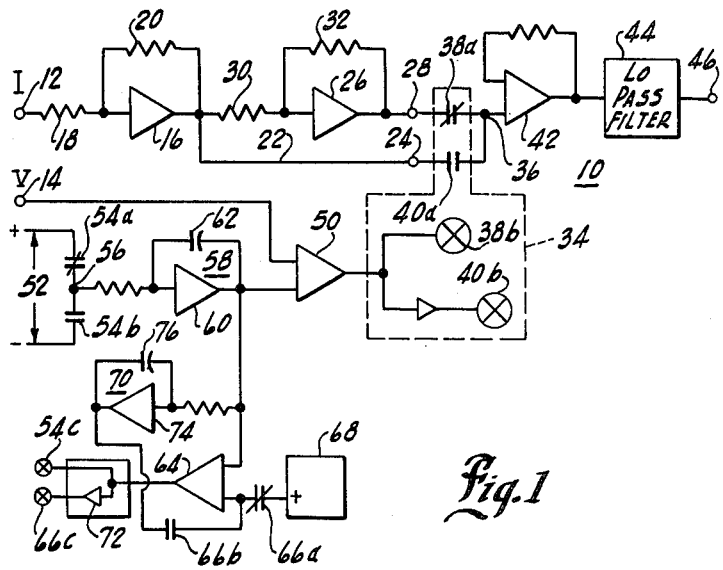
FIG. 1 is a schematic diagram of an exemplary embodiment of the watt meter of the present invention.

In FIG. 1, the watt meter of the present invention is identified by the numeral 10. Watt meter 10 contains two input terminals 12 and 14 to which the voltage and current inputs used to determine power are connected. For exemplary purposes, it may be assumed that the current input is connected to terminal 12 and the voltage input is connected to terminal 14.

Terminal 12 is connected to the input of differential or operational amplifier 16, the gain of which determined by the magnitudes of input resistor 18 and feedback resistor 20. Amplifier 16 typically provides a gain of 10 to 100 along with an inversion of the polarity of the output signal with respect to the input signal. The inverted output signal of amplifier 16 is provided in conductor 22 to terminal 24.

The output of amplifier 16 is also connected to the input of a second signal inverting operational amplifier 26. Due to the double inversion, the polarity of the output signal of operational amplifier 26 is the same as that of the input signal to terminal 12. The output signal is provided to terminal 28. Operational amplifier 26 has unity gain as established by equal input and feedback resistors 30 and 32, respectively.

The signals on terminals 24 and 28 are proportional to the current signal applied to input terminal 12, equal to each other in magnitude, but opposite in polarity, by virtue of the inversions provided by amplifiers 16 and 26.

Terminals 24 and 28 are connected through a switch means 34 to terminal 36. While switch means 34 is illustratively shown in FIG. 1 as having a pair of switch contacts 38a and 40a operable by operators 38b and 40b, for purposes of explanation, in a practical embodiment of the present invention, switch means 34 may comprise a semi-conductor switch. The semi-conductor analog switch element made and sold by RCA under the designation 4066 or made and sold by Motorola under the designation 14066 may be employed as switch means 34. Such elements may employ a field effect transistor or complementary metal oxide semi-conductor element for switching purposes.

The switching operation of switching means 34 is such that when one of the contacts is closed, the other is open and vice versa, so that one or the other of the signals at terminals 24 and 28 is applied to terminal 36 for the period of time during which the respective switch contact 38a or 40a is closed.

Terminal 36 is connected to the input of a unity follower amplifier 42 which provides impedance matching. The output of amplifier 42 is provided to low pass filter 44 and to output terminal 46 of watt meter 10.

The opening and closing switch contacts 38a and 40a is accomplished responsive to the second input to watt meter 10, in this case, the voltage input at input terminal 14. Input terminal 14 is connected to one input of comparator 50, shown as a differential amplifier, the output of which is connected to operator 38b and 40b. An inverting amplifier 51 is interposed between comparator 50 and one of the operators.

Figure 2A:
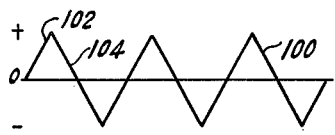
FIGS. 2A through H are graphs showing certain signals developed during operation of the watt meter.

The other input to comparator 50 comprises a cyclical voltage wave such as triangular voltage wave shown in FIG. 2A. As the magnitude, symmetry, and linearity of wave form all effect the accuracy of power measurement, it is necessary to precisely generate this wave form. To produce the cyclical triangular wave from shown in FIG. 2A, the positive and negative voltages of voltage source 52 are connected through switch contacts 54a and 54b to center tap 56. Tap 56 is connected to the input of an integrator 58 containing operational amplifier 60 having a capacitor 62 in its feedback path. The output of integrator 58 is connected to the other input of comparator 50.

The output of integrator 58 is also connected to one output of a second voltage comparator 64. Comparator 64 is of the high speed type. The other input to comparator 64 is switchable by switch contacts 66a and 66b to either a precise positive reference voltage from highly accurate reference source 68 or a regulated negative voltage from second integrator 70. The output of comparator 64 is provided to a logic circuit 72 containing an inverting amplifier, which controls the energization of operator 54c for switch contacts 54a and 54b and operator 66c for switch contacts 66a and 66b. Switches 54 and 66 may also be semi-conductor analog switch elements.

Second integrator 70 contains operational amplifier 74 and capacitor 76. The time constant of integrator 70 is substantially greater than that of integrator 58, for example, from 100 to 10,000 times longer. Integrator 70 integrates the areas of the cyclical wave above and below the vertical axis and establishes the negative voltage at its output to comparator 64 at a level which maintains the two areas equal.

The operation of watt meter 10 is as follows: With voltage source 52 energized to apply an input voltage to tap 56 through one of the switch contacts 54a or 54b, for example, contacts 54b, integrator 58 commences to generate a linear signal 102, for example, positive going signal 102 at its output. This signal is provided to comparator 50 and to comparator 64. When the magnitude of the output voltage of integrator 58 attains that of precise reference 66 provided to comparator 64 through closed switch 66a, the output condition of comparator 64 is altered to operate logic circuit 72. Logic circuit 72 controls operator 54c to open switch contacts 54b and close switch contact 54a to commence the generation of a linear negative going signal 104. Logic circuit 72 also controls operator 68 to remove the positive reference voltage to comparator 64 and apply the negative voltage from the output of integrator 70 to comparator 64 to establish the negative limit for the generation of the negative going signal 104. The use of a high quality operational amplifier 60 and capacitor 62 insures linearity to voltages 102 and 104. The high speed of comparator 64 and the accuracy of the reference voltage from precise reference voltage source 66 assists in obtaining proper magnitude.

When the magnitude of the negative going signal 104 becomes the same as the negative voltage from integrator 70, comparator 64 and logic circuit 72 operate to commence the generation of positive going signal 102 and reapply the positive voltage of precise reference 6B to comparator 64. The generation of the cyclical wave form may typically be carried out at a frequency of 10KHz.

The peak negative magnitude and the symmetry of the triangular voltage wave 100 is insured by integrator 70. As noted above, integrator 70 measures the area under the wave form above and below the neutral axis. In the event a difference in areas develops, indicating a lack of symmetry to triangular wave form 100, integrator 70 changes its negative voltage to switch contact 68b in a manner to reduce the difference in areas to zero.

Triangular voltage wave 100 at the output of integrator 58 is provided to the input of comparator 50. In the absence of any voltage signal at terminal 14, comparator 50 closes one of switch contacts 38a or 40a for the first half of the cycle of the wave and the other switch contact for the second half of the cycle.

In the absence of any current signal to input terminal 12, there is no voltage at terminals 24 and 28, no signal through the alternately closed switch contacts 38a and 40a, no input to unity follower amplifier 42 or low pass filter 44 and no output to terminal 46 of watt meter 10.

With a current input to input terminal 12, a signal appears at the terminal 28 and an equal but opposite signal appears at signal 24. These voltages are alternately applied to terminal 36 by virtue of the alternative switching action of switch contacts 38a and 40a so that the signal generated at terminal 36 is that shown in FIG. 2B. This signal is passed through unity follower amplifier 42 to low pass filter 44.

The frequencies passed by filter are selected in accordance with the frequency of cyclical wave 100. For the 10KHz frequency noted above, low pass filter 44 typically passes frequencies of 1500 Hz and less. The switching frequency of the cyclical wave form, and its harmonics, are thus, rejected. If responsiveness to higher frequencies is required of watt meter 10, low pass filter 44 may be altered to increase the frequencies which may be passed and the switching frequency of the cyclical wave also increased. If a d.c.-like output signal is desired, all frequencies above, for example, 10 Hz may be filtered.

Figure 2B:
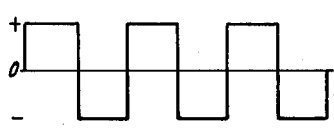

By virtue of the filtering characteristic of low pass filter 44, the equality in area of the voltage wave form shown in FIG. 2B above the neutral axis and below the axis is indicated so that the net output of low pass filter 44 to output terminal 46 is zero.

Figure 2C:
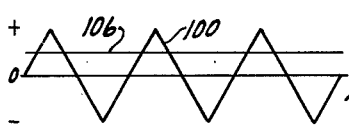
Figure 2D:
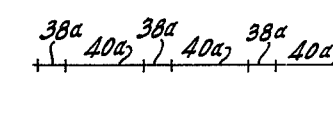

The operation of watt meter 10 with a voltage input to input terminal 14 in the absence of a current input to input terminal 12 is as follows. The input voltage is shown as 106 in FIg. 2C and is provided to comparator 50. The presence of voltage 106 alters the operation of comparator 50 and switch means 34 so that instead of switch contacts 38a and 40a being alternately closed for equal periods of time, one of the switch contacts is closed for a shorter period of time. Thus, as is shown in FIG. 2D, switch contact 38a any be opened for the period of time during which the triangular voltage wave 100 exceeds voltage 106 while switch contact 40a may be closed during the period in which voltage 106 exceeds voltage 100. However, in the absence of any signals at terminals 24 and 28, no input signal is provided to terminal 36 by virtue of this switching action and no output is provided at output terminal 46 of watt meter 10.

Figure 2E:
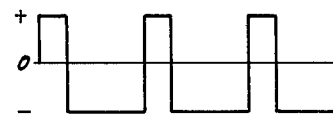
Figure 3A:
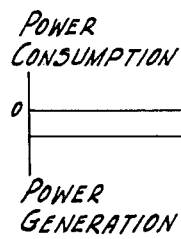
FIGS. 3A through 3D show the electrical output signal provided by the watt meter of the present invention.

With input signals applied to both input terminal 12 and input terminal 14, the operation of watt meter 10 is as follows. It may be assumed that the voltage signal applied to input 14 is signal 106 shown in FIG. 2C and that the input signal to input terminal 12 is of the magnitude of the signal used in connection with FIG. 2B, supra. A positive signal of this magnitude is applied to terminal 28 while a negative signal of this magnitude is applied to terminal 24. The switching action of switch means 34 resembles that shown in FIG. 2D. Thus, the positive signal at terminal 28 is applied to terminal 36 during the period of time in which switch 38a is closed while the negative signal is applied during the longer period in which switch contacts 40a are closed to produce the voltage wave form shown in FIG. 2E. It will be appreciated that for each cycle of the wave form shown in FIG. 2E net negative volt-seconds are produced. The signal, when passed through low pass filter 44 to output terminal 46 of watt meter 10, provides an output signal proportional to power. Successive cycles will indicate power for a longer period as represented by a D.C. signal in FIG. 3A.

The multiplication of the current signal applied to input terminal 12 and the voltage signal applied to input terminal 14 is obtained by the combined action of the positive and negative signals at terminals 28 and 24, respectively, and the switching action of switch means 34.

Figure 2F:
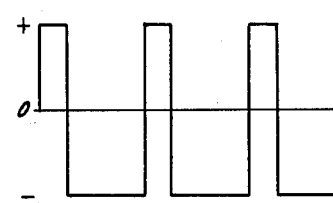
Figure 3B:
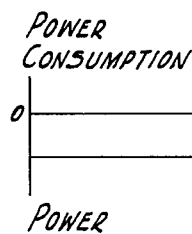

In the event the current signal to input terminal 12 increases, the magnitude of the signals at terminals 24 and 28 increases, as shown in FIG. 2F. In the absence of any change in the voltage signal applied to input terminal 14, the periods during which the signals are applied are not altered so that the increased voltage wave form of FIG. 2F results. This wave form contains a greater negative volt-seconds characteristic resulting in the greater output of watt meter 10 shown in FIg. 3B.

Figure 2G:
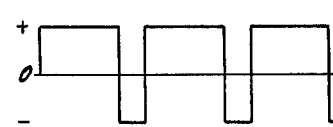
Figure 3C:
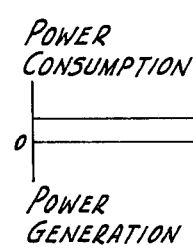

Alterations in the voltage signal provided to input terminal 14 alters the relative periods of time during which the positive and negative signals are applied to terminal 36 and the magnitude of the output signal at output terminal 46 of watt meter 10. Should the polarity of the voltage signal applied to input terminal 14 be reversed, the relative magnitude of the switching periods of contacts 38a and 40a is reversed, as shown in FIG. 2G to provide a greater positive volt-second characteristic to the voltage wave applied to terminal 36. This reverses the polarity of the output signal watt meter 10 at output terminal 46, as shown in FIG. 3C.

Figure 2H:
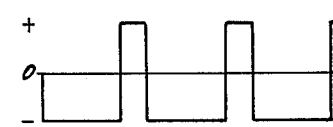
Figure 3D:
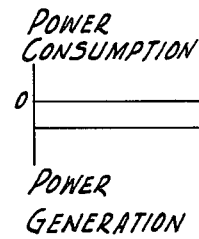

Similarly, if the current signal to input terminal 12 is reversed in polarity, while no change in the voltage signal to input terminal 14 takes place, the polarity of the voltage at contacts 38a and 40a is reversed, and the voltage wave form shown in FIG. 2G becomes reversed, resulting in a greater negative volt-second characteristic as shown in FIG. 2H. The polarity of the output signal of watt meter 10 in reversed, as shown in FIG. 3D.

True four-quadrant multiplication of the voltage and current to indicate power consumed or generated is thus obtained with watt meter 10 of the present invention.

The operation of watt meter 10 may be characterized as a sampling technique in which the power occurring during a sampling interval of time comprising one duty cycle in the operation of switch means 34 is ascertained and summed with the power obtained during previous and successive sampling intervals to provide an electrical signal indicative of power. Sampling intervals are short enough to effectively provide successive multiplication of instantaneous values of both variables.

Various modes of carrying out the invention are contemplated as being within the scope of the following claims particularly pointing out and distinctly claiming the subject matter which is regarded as the invention.

I claim:

1. A watt meter circuit for receiving input signals proportional to the voltage across, and the current through, an electrical element at input terminals and for providing an electrical signal indicative of power at an output terminal, said circuit comprising:

signal forming means coupled to a first of said input terminals for receiving the input signal applied thereto and for providing a pair of signals corresponding to the input signal, said signals being equal to each other in magnitude but opposite to each other in polarity;

switch means having make-break elements actuatable by a signal responsive operator means and receiving said pair of signals for alternately providing said signals to a signal terminal to form a signal wave having portions of alternating opposite polarity in a variable duty cycle;

means connected to said switch means and to the output terminal of said watt meter for providing the electrical signal indicative of power from the signal obtained at said signal terminal;

signal generating means generating a cyclical wave, having half cycles alternating in polarity, said wave being formed of linear partial wave portions and having equal positive and negative peaks; and comparator means having one input connected to said signal generating means and the other input connected to a second input terminal and having an output connected to said operator means of said switch means for controlling the operation of said make-break elements of said switch means and the duty cycle of said cyclical wave in accordance with the relative magnitude of said input signal and said cyclical wave.

2. The watt meter circuit according to claim 1 wherein said signal forming means includes first and second series connected, inverting amplifiers, the input of the first amplifier being connected to said first input terminal, the output of said first amplifier providing the one of said pair of signals inverted in polarity with respect to the input signal, the output of said first amplifier also being connected to the input of said second amplifier, said second amplifier having unity gain and having an output providing the other of said pair of signals having the same polarity as the input signal.

3. The watt meter according to claim 1 wherein said means connected to said switch means comprises a low pass filter.

4. The watt meter according to claim 1 wherein said signal generating means is further defined as generating a cyclical wave in which the slope properties of said partial wave portions are substantially constant.

5. The watt meter circuit according to claim 1 wherein said signal generating means further defined as generating a triangular cyclical wave.

6. The watt meter circuit according to claim 5 wherein said signal generating means is further defined as generating a triangular wave having equilateral triangles above and below the neutral axis.

7. The watt meter circuit according to claim 6 wherein said signal generating means includes integrator means having an output providing linear positive and negative going output signals of constant slope, a reference signal source means providing a reference signal; comparator means having an input coupled to said integrator means and said reference signal source for ascertaining when the magnitude of said positive and negative going output signals attains that of the reference signal; said comparator having an output coupled the input of said integrator means for altering the direction of the output signal of said integrator means when said output signal attains the magnitude of said reference signal.

8. The watt meter circuit according to claim 7 wherein said reference signal source further includes adjustment means responsive to said cyclical wave being generated for adjusting the magnitude of said reference signal to maintain the equality of the positive and negative peaks.

9. The watt meter circuit according to claim 8 wherein said adjustment means comprises a second integrator responsive to variations in the magnitudes of the half cycles of the cyclical wave for altering the reference signal to maintain equality in the magnitudes of the half cycles, said second integrator having a long time constant with respect to said integrator means.

10. The watt meter circuit according to claim 8 wherein said reference signal source further includes a precise reference signal source providing a precise reference signal of one polarity to said comparator and wherein said adjustment means provides an adjustable reference signal of the opposite polarity for maintaining the equality of the positive and negative peaks.

* * * * *